United States Patent
Huang et al.

(10) Patent No.: US 8,016,460 B2
(45) Date of Patent: Sep. 13, 2011

(54) CONVERGING ELEMENT FOR LED

(75) Inventors: Tien-Fu Huang, Baoshan Township, Hsinchu County (TW); Shih-Hao Hua, Sihu Township, Changhua County (TW); Chen-Dao Shaio, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 226 days.

(21) Appl. No.: 12/389,472

(22) Filed: Feb. 20, 2009

(65) Prior Publication Data
US 2010/0073940 A1    Mar. 25, 2010

(30) Foreign Application Priority Data
Sep. 22, 2008  (TW) ................................ 97136376 A

(51) Int. Cl.
*F21V 11/00* (2006.01)
(52) U.S. Cl. ................. 362/361; 362/296.1; 362/311.12; 359/641
(58) Field of Classification Search .................. 362/361, 362/311.02, 296.1; 359/641, 647, 648
See application file for complete search history.

(56) References Cited

U.S. PATENT DOCUMENTS

| 4,698,730 | A | * | 10/1987 | Sakai et al. | 362/311.05 |
| 6,188,527 | B1 | * | 2/2001 | Bohn | 359/710 |
| 7,192,153 | B2 | * | 3/2007 | Aoshima et al. | 362/109 |
| 2005/0201114 | A1 | * | 9/2005 | Komatsu | 362/509 |
| 2005/0285133 | A1 | * | 12/2005 | Hung | 257/99 |
| 2006/0082999 | A1 | * | 4/2006 | Klein | 362/311 |

FOREIGN PATENT DOCUMENTS
CN     101728464 A     6/2010
* cited by examiner

*Primary Examiner* — Evan Dzierzynski
(74) *Attorney, Agent, or Firm* — Rabin & Berdo, P.C.

(57) ABSTRACT

A converging element for an LED is described, which is used for converging light rays emitted from a light-emitting chip to enable the light rays to form approximately parallel light rays after passing through the converging element. The converging element for LED includes a cylinder and a first lens. The cylinder is disposed on the light-emitting chip. The first lens is disposed on the other end of the cylinder opposite to the light-emitting chip. The first lens has a first plane and a first curved surface opposite to each other. The first plane of the first lens is attached to the cylinder.

5 Claims, 9 Drawing Sheets

CONVERGING ELEMENT FOR LED

CROSS-REFERENCE TO RELATED APPLICATIONS

This non-provisional application claims priority under 35 U.S.C. §119(a) on Patent Application No(s). 097136376 filed in Taiwan, R.O.C. on Sep. 22, 2008 the entire contents of which are hereby incorporated by reference.

BACKGROUND OF THE INVENTION

1. Field of the Invention

The present invention relates to a converging element for an LED, and more particularly to a converging element for a light-emitting chip, which reduce a light-emitting angle of the light-emitting chip and enable the light-emitting chip to uniformly illuminate a light-receiving surface, so as to increase the energy of the illuminated area.

2. Related Art

In the manufacturing process of electronic elements, extremely fine metallic circuits or semiconductor structures need to be manufactured. In order to achieve this condition for the manufacturing process, the process and methods of lithography techniques are usually utilized. In a conventional lithography technique, a surface of a wafer is cleaned first, and then coated with a photo resist containing photosensitive chemical substance. Afterwards, a photo mask with a designed pattern is fabricated and placed on the surface of the wafer. Then, light rays emitted from a light source pass through a transparent area of the photo mask. The light rays passing through the photo mask react with the photo resist. This step is generally referred to as exposure.

As for conventional exposure machines, mercury-xenon short-arc lamps are mostly used as light sources. An ultraviolet light is emitted from a mercury-xenon short-arc lamp and passes through a transparent area of the photo mask. Then, a chemical change occurs between the ultraviolet light passing through the photo mask and the photo resist that reacts with the ultraviolet light. However, since a high voltage is required to actuate the mercury-xenon short-arc lamp and the required illumination power cannot be reached until a warm-up time elapsed, and thus, there are many limitations in usage.

In order to avoid the limitations of the conventional mercury-xenon short-arc lamp in usage, some manufacturers adopt an LED to replace the conventional mercury-xenon short-arc lamp. An LED can emit light immediately upon being powered on and does not require a high voltage as the mercury-xenon short-arc lamp. Meanwhile, a frequency band of the emitted ultraviolet light can be controlled by selecting a light-emitting chip. However, since the light-emitting chip is an extended light source, the extended light source emitted from the light-emitting chip needs to be converged into a parallel light source by a light transmissive lens, so as to avoid non-uniform illumination and change in the shape of light rays from the extended light source after passing through the photo mask when the LED is used as a light source for exposure. Meanwhile, in order to provide an ultraviolet light with a higher power to replace the conventional mercury-xenon short-arc lamp, a large-sized high-power light-emitting chip needs to be used. Therefore, a converging element needs to be designed for the large-sized high-power light-emitting chip, such that the light ray emitted from the light-emitting chip through the converging element becomes a parallel light.

SUMMARY OF THE INVENTION

Accordingly, the present invention is directed to a converging element for an LED, which is used for converting a light ray emitted from a light-emitting chip into a parallel light.

The present invention provides a converging element for an LED, which is used for converging a light ray emitted from a light-emitting chip to enable the light ray to form an approximately parallel light ray after passing through the converging element for an LED. The converging element for an LED includes a cylinder and a first lens.

The light-emitting chip may be a square-shaped structure with a side length of d.

One end of the cylinder is disposed on the light-emitting chip. A central position of the light-emitting chip may be disposed at a central position of one end of the cylinder.

The first lens is disposed on the other end of the cylinder opposite to the light-emitting chip. The first lens has a first plane and a first curved surface opposite to each other. The first plane of the first lens is attached to the other end of the cylinder opposite to the light-emitting chip.

A height h and a radius a of the cylinder vary with the side length d of the light-emitting chip. The conditions for the range of the height h are mainly listed as follows: determining a light-emitting angle θ of the LED first, and then calculating the height h of the cylinder according to the side length d of the light-emitting chip, thereby eliminating the difference between the light-emitting angle at the axis center and the light-emitting angle at the edge when the light-emitting chip is too large, and thus reducing the design error.

Herein, in order to eliminate the difference between the light-emitting angle at the axis center and the off-axis light-emitting angle of the light-emitting chip, the relation between the height h and the radius a of the cylinder and the side length d of the light-emitting chip should satisfy Conditional Expression 1, so as to limit the angle difference to be less than 1°.

$$\theta - \theta' \leq 1° \qquad \text{Conditional Expression 1}$$

θ is an angle formed between a normal direction at the central position of the light-emitting chip (i.e., at the central position of the cylinder) and a connecting line from the center of the light-emitting chip to a position on the circumference of the cylinder where the first lens is attached to. θ' is an angle formed between a normal direction at one end of the light-emitting chip (i.e., at a position far away from the central position of the cylinder by d/2) and a connecting line from one end of the light-emitting chip to the position on the circumference of the cylinder where the first lens is attached to.

Conditional Expression 1 can be converted into Equation 1 by using a trigonometric function:

$$\tan^{-1}\left(\frac{a}{h}\right) - \tan^{-1}\left(\frac{a}{h} - \frac{d}{2h}\right) \leq 1°, \qquad \text{Equation 1}$$

in which h is the height of the cylinder, a is the radius of the cylinder, and d is the side length of the light-emitting chip.

If the side length d of the light-emitting chip and the height h of the cylinder are known values, the radius a of the cylinder can be obtained by using Equation 1. Likewise, if the side length d of the light-emitting chip and the radius a of the cylinder are known values, the height h of the cylinder can be obtained by using Equation 1.

In other words, the height h and the radius a of the cylinder can be obtained by using the side length d of the light-emitting chip and Equation 1. Therefore, a user can determine the size of the cylinder to be used according to the side length d of the adopted light-emitting chip.

Moreover, it is assumed that a curvilinear equation of the first curved surface is Equation A:

$$y = -ex^2 + (h + \Delta h), \qquad \text{Equation A}$$

in which $\Delta h$ is a minimum distance between a center point of the first plane of the first lens and a center point of the first curved surface of the first lens.

The central position of a portion where the light-emitting chip is attached to the cylinder is assumed to be an origin O, and the coordinates of the origin O (i.e., the central position of the portion where the light-emitting chip is attached to the cylinder) are assumed to be (x, y)=(0, 0).

Therefore, the coordinates of a position Q on a circumference of the cylinder where the first lens is attached to are (x, y)=(a, h).

After the coordinates of the point Q (x, y)=(a, h) are substituted into Equation A, Equation B can be obtained:

$$e = \frac{\Delta h}{a^2}. \qquad \text{Equation B}$$

After Equation B is substituted back into Equation A, Equation C can be obtained:

$$y = -\frac{\Delta h}{a^2} x^2 + (h + \Delta h). \qquad \text{Equation C}$$

Equation C is x-differentiated to obtain a slope of the first curved surface passing through the position Q, as shown in the following Equation D:

$$y' = -\frac{2\Delta h}{a} x. \qquad \text{Equation D}$$

A tangential equation of the point Q (a, h) can be obtained from Equation D, that is, the following Equation E:

$$(y - h) = -\frac{2\Delta h}{a}(x - a). \qquad \text{Equation E}$$

When x=0 is substituted into Equation E, Equation F can be obtained, thereby obtaining a position of an intersection point between a tangent at the point Q and the Y axis:

$$y = h + 2\Delta h. \qquad \text{Equation F}$$

When y=0 is substituted into Equation E, Equation G can be obtained, thereby obtaining a position of an intersection point between a tangent at the point Q and the X axis:

$$x = a\left(1 + \frac{h}{2\Delta h}\right). \qquad \text{Equation G}$$

$\alpha$ is an angle formed between the tangent at the point Q and a direction of the light ray exiting from the point Q. However, in order to enable all the light rays emitted from the light-emitting chip to exit along a parallel direction after passing through the first curved surface, the Y axis direction (i.e., one side of the cylinder) is taken as a direction along which the light rays exit in parallel. $\beta_1$ is an incident angle for the light rays emitted from the light-emitting chip to be incident on the point Q, and $\beta_2$ is an emergence angle for the light rays emitted from the light-emitting chip to exit at the point Q.

Therefore, Equation H can be obtained by using Equation F and Equation G:

$$\tan\alpha = \frac{a\left(1 + \frac{h}{2\Delta h}\right)}{h + 2\Delta h} = \frac{a}{2\Delta h}. \qquad \text{Equation H}$$

After $$\alpha = \frac{\pi}{2} - \beta_2$$

is substituted into Equation H, Equation I and Equation J can be derived:

$$\tan\left(\frac{\pi}{2} - \beta_2\right) = \frac{a}{2\Delta h} \qquad \text{Equation I}$$

$$\Rightarrow \tan\beta_2 = \frac{2\Delta h}{a};$$

and $$\Rightarrow \sin\beta_2 = \frac{2\Delta h}{\sqrt{a^2 + (2\Delta h)^2}}. \qquad \text{Equation J}$$

It is assumed that the cylinder and the first lens are made of the same material and have the same refraction index $n_1$. $n_1 > n_2$, $n_1$ is a refractive index of the cylinder and the first lens, and $n_2$ is a refractive index of air. According to the Snell's law: $n_1 \sin \beta_1 = n_2 \sin \beta_2$, Equation K and Equation L can be obtained. ($n_1$ and $n_2$ are not shown in the figure)

$$\cos\beta_1 = \sqrt{1 - \sin^2\beta_1} = \sqrt{1 - \left(\frac{n_2}{n_1}\sin\beta_2\right)^2}; \qquad \text{Equation K}$$

and $$\tan\beta_1 = \frac{\sin\beta_1}{\cos\beta_1} \qquad \text{Equation L}$$

$$= \frac{\frac{n_2}{n_1}\sin\beta_2}{\sqrt{1 - \left(\frac{n_2}{n_1}\sin\beta_2\right)^2}}$$

$$= \frac{\frac{n_2}{n_1} \frac{2\Delta h}{\sqrt{a^2 + (2\Delta h)^2}}}{\sqrt{1 - \left(\frac{n_2}{n_1} \frac{2\Delta h}{\sqrt{a^2 + (2\Delta h)^2}}\right)^2}}.$$

Moreover, since $\theta = \beta_2 - \beta_1$, Equation 2 can be obtained:

$$\tan\theta = \tan(\beta_2 - \beta_1) \qquad \text{Equation 2}$$

$$= \frac{\tan\beta_2 - \tan\beta_1}{1 + \tan\beta_2 \tan\beta_1}$$

-continued $$= \frac{a}{h}.$$

The minimum distance Δh between the center point of the first plane and the center point of the first curved surface can be obtained by substituting Equation I and Equation L into Equation 2 and combining with Equation 1.

The first curved surface includes a first endpoint, at least one midpoint, and a second endpoint. The midpoint is located between the first endpoint and the second endpoint and satisfies Equation 3 (i.e., a Bezier Curve):

$$P(t)=(1-t)^2 P_0 + 2t(1-t)P_1 + t^2 P_2.$$ Equation 3

$P(t)$ is the midpoint, $P_0$ is the first endpoint, $P_2$ is the second endpoint, $P_1$ is an intersection point between a curve tangent passing through the first endpoint and a curve tangent passing through the second endpoint, and t is between 0 and 1. During the above derivation processes of Equation 1 and Equation 2, the position of the midpoint (i.e., P(t)) of the first curved surface, the position Q (i.e., $P_0$) on the circumference of the cylinder where the first lens is attached to, and another position (i.e., $P_2$) corresponding to the Q on the circumference of the cylinder where the first lens is attached to can be obtained, and a curve of the first curved surface can be defined according to Equation 3.

According to another converging element for an LED in the present invention, a second lens is further disposed between the cylinder and the light-emitting chip. The second lens has a second plane and a second curved surface opposite to each other. The second plane of the second lens is attached to the other end of the cylinder opposite to the first lens. A center point of the second curved surface of the second lens is attached to the light-emitting chip. When a light ray emitted from the light-emitting chip is incident on the second lens, the following Equation 4 is satisfied:

$$n_4 \sin \theta_4 \geq n_3 \sin \beta_3;$$

when $$\theta_3 = \tan^{-1} \frac{a}{h},$$

$n_4 < n_3$, is substituted into the equation, the following Equation 4 is obtained.

$$n_4 \sin \theta_4 \geq n_3 \sin\left(\tan^{-1} \frac{a}{h}\right).$$ Equation 4

$n_4$ is a refractive index of air, $n_3$ is a refractive index of the second lens, $\theta_4$ is a light-emitting angle of the light-emitting chip, and $\theta_3$ is an angle of the light ray emitted from the light-emitting chip when passing through the second curved surface or the second plane. As known form Equation 4, when the light ray emitted from the light-emitting chip passes through the second curved surface of the second lens, the light-emitting angle can be reduced and the energy can be focused on the first curved surface of the first lens, and thus the light ray is converged into an approximately parallel light beam.

As for a converging element for an LED according to the present invention, the height and the radius of the cylinder of the converging element for an LED required for being used together with the side length of the light-emitting chip are first calculated according to Equation 1. Then, the minimum distance between the center point of the first plane of the first lens and the center point of the first curved surface of the first lens is derived from Equation 2. Finally, positions of the points on the first curved surface are derived from Equation 3. Therefore, a converging element for an LED can be obtained through deviation according to Equation 1 to Equation 3, which is used for converging a light ray emitted from the light-emitting chip to enable the light ray to form an approximately parallel light ray after passing through the converging element for an LED.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
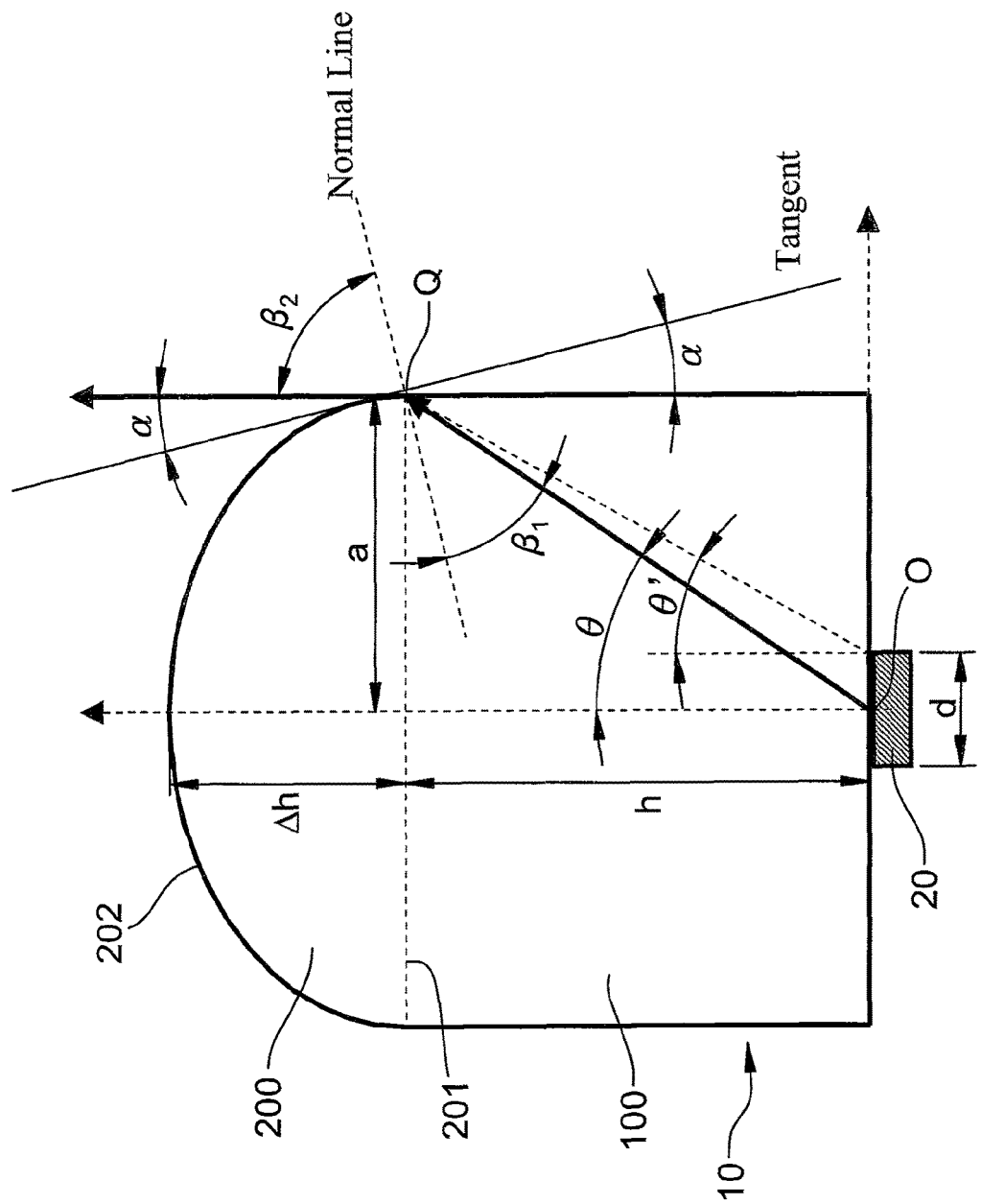
FIG. 1 is a schematic cross-sectional view of a first embodiment of the present invention.

FIG. 1 is a schematic cross-sectional view of a first embodiment of the present invention. Referring to FIG. 1, in this embodiment, a converging element for an LED 10 is used for converging a light ray emitted from a light-emitting chip 20 to enable the light ray to form an approximately parallel light ray after passing through the converging element for an LED 10. The converging element for an LED 10 includes a cylinder 100 and a first lens 200.

Upon being powered on, the light-emitting chip 20 emits a light ray at a certain frequency band. The light-emitting chip 20 may be a square-shaped structure with a side length of d. It should be understood that, the light-emitting chip 20 may also be rectangular or of other geometric shapes.

One end of the cylinder 100 is disposed on the light-emitting chip 20. A central position of the light-emitting chip 20 may be disposed at a central position of one end of the cylinder 100.

The first lens 200 is disposed on the other end of the cylinder 100 opposite to the light-emitting chip 20. The first lens 200 has a first plane 201 and a first curved surface 202 opposite to each other. The first plane 201 of the first lens 200 is attached to the other end of the cylinder opposite to the light-emitting chip 20.

A height h and a radius a of the cylinder 100 vary with a side length d of the light-emitting chip 20. The conditions for the range of the height h are mainly listed as follows: determining a light-emitting angle θ of the LED first, and then calculating the height h of the cylinder 100 according to the side length d of the light-emitting chip 20, thereby eliminating the difference between a light-emitting angle at the axis center and a light-emitting angle at the edge when the light-emitting chip 20 is too large, and thus reducing the design error.

Herein, in order to eliminate the difference between the light-emitting angle at the axis center and the off-axis light-emitting angle of the light-emitting chip 20, the relation between the height h and the radius a of the cylinder 100 and the side length d of the light-emitting chip 20 should satisfy Conditional Expression 1, so as to limit the angle difference to less than 1°.

$$\theta - \theta' \leq 1° \qquad \text{Conditional Expression 1}$$

θ is an angle formed between a normal direction at the central position of the light-emitting chip 20 (i.e., at the central position of the cylinder 100) and a connecting line from the center of the light-emitting chip 20 to a position Q on a circumference of the cylinder 100 where the first lens 200 is attached to. θ' is an angle formed between a normal direction at one end of the light-emitting chip 20 (i.e., at a position far away from the central position of the cylinder 100 by d/2) and a connecting line from one end of the light-emitting chip 20 to the position Q on the circumference of the cylinder 100 where the first lens 200 is attached to.

Conditional Expression 1 can be converted into Equation 1 by using a trigonometric function.

$$\tan^{-1}\left(\frac{a}{h}\right) - \tan^{-1}\left(\frac{a}{h} - \frac{d}{2h}\right) \leq 1° \qquad \text{Equation 1}$$

If the side length d of the light-emitting chip and the height h of the cylinder 100 are known values, the radius a of the cylinder 100 can be obtained according to Equation 1. Likewise, if the side length d of the light-emitting chip and the radius a of the cylinder 100 are known values, the height h of the cylinder 100 can be obtained according to Equation 1.

In other words, the height h and the radius a of the cylinder can be obtained by using the side length d of the light-emitting chip and Equation 1. Therefore, a user can determine the size of the cylinder to be used according to the side length d of the adopted light-emitting chip.

Moreover, it is assumed that a curvilinear equation of the first curved surface 202 is Equation A:

$$y = -ex^2 + (h + \Delta h), \qquad \text{Equation A}$$

in which Δh is a minimum distance between a center point of the first plane 201 of the first lens 200 and a center point of the first curved surface 202 of the first lens 200.

The central position of a portion of the light-emitting chip 20 where the cylinder 100 is attached to is assumed to be an origin O, and the coordinates of the origin O (i.e., the central position of the portion of the light-emitting chip 20 where the cylinder 100 is attached to) are assumed to be (x, y)=(0, 0).

Therefore, the coordinates of the position Q on the circumference of the cylinder 100 where the first lens 200 is attached to are (x, y)=(a, h).

After the coordinates of the point Q (x, y)=(a, h) are substituted into Equation A, Equation B can be obtained:

$$e = \frac{\Delta h}{a^2}. \qquad \text{Equation B}$$

After Equation B is substituted back into Equation A, Equation C can be obtained:

$$y = -\frac{\Delta h}{a^2}x^2 + (h + \Delta h). \qquad \text{Equation C}$$

Equation C is x-differentiated to obtain a slope of the first curved surface 202 passing through the position Q, as shown in the following Equation D:

$$y' = -\frac{2\Delta h}{a}x. \qquad \text{Equation D}$$

A tangential equation of the point Q (a, h) can be obtained from Equation D, that is, the following Equation E:

$$(y - h) = -\frac{2\Delta h}{a}(x - a). \qquad \text{Equation E}$$

When x=0 is substituted into Equation E, Equation F can be obtained, thereby obtaining a position of an intersection point between a tangent at the point Q and the Y axis:

$$y = h + 2\Delta h. \qquad \text{Equation F}$$

When y=0 is substituted into Equation E, Equation G can be obtained, thereby obtaining a position of an intersection point between a tangent at the point Q and the X axis:

$$x = a\left(1 + \frac{h}{2\Delta h}\right). \qquad \text{Equation G}$$

Referring to FIG. 1, α is an angle formed between the tangent at the point Q and a direction of the light ray exiting at the point Q. However, in this embodiment, in order to enable all the light rays emitted from the light-emitting chip 20 to exit along a parallel direction after passing through the first curved surface 202, the Y axis direction (i.e., one side of the cylinder) is taken as a direction along which the light rays exit in parallel. $\beta_1$ is an incident angle for the light rays emitted from the light-emitting chip 20 to be incident on the point Q, and $\beta_2$ is an emergence angle for the light rays emitted from the light-emitting chip 20 to exit at the point Q.

Therefore, Equation H can be obtained by using Equation F and Equation G:

$$\tan\alpha = \frac{a\left(1 + \frac{h}{2\Delta h}\right)}{h + 2\Delta h} = \frac{a}{2\Delta h}. \qquad \text{Equation H}$$

After $$\alpha = \frac{\pi}{2} - \beta_2$$

is substituted into Equation H, Equation I and Equation J can be derived.

$$\tan\left(\frac{\pi}{2} - \beta_2\right) = \frac{a}{2\Delta h} \quad \text{Equation I}$$

$$\Rightarrow \tan\beta_2 = \frac{2\Delta h}{a}$$

$$\Rightarrow \sin\beta_2 = \frac{2\Delta h}{\sqrt{a^2 + (2\Delta h)^2}} \quad \text{Equation J}$$

It is assumed that the cylinder 100 and the first lens 200 are made of the same material and have the same refraction index $n_1$. $n_1 > n_2$, in which $n_1$ is a refractive index of the cylinder and the first lens, and $n_2$ is a refractive index of air. According to the Snell's law: $n_1 \sin\beta_1 = n_2 \sin\beta_2$, Equation K and Equation L can be obtained. ($n_1$ and $n_2$ are not shown in the figure)

$$\cos\beta_1 = \sqrt{1 - \sin^2\beta_1} = \sqrt{1 - \left(\frac{n_2}{n_1}\sin\beta_2\right)^2} \quad \text{Equation K}$$

$$\tan\beta_1 = \frac{\sin\beta_1}{\cos\beta_1} \quad \text{Equation L}$$

$$= \frac{\frac{n_2}{n_1}\sin\beta_2}{\sqrt{1 - \left(\frac{n_2}{n_1}\sin\beta_2\right)^2}}$$

$$= \frac{\frac{n_2}{n_1}\frac{2\Delta h}{\sqrt{a^2 + (2\Delta h)^2}}}{\sqrt{1 - \left(\frac{n_2}{n_1}\frac{2\Delta h}{\sqrt{a^2 + (2\Delta h)^2}}\right)^2}}$$

Moreover, since $\theta = \beta_2 - \beta_1$, Equation 2 can be obtained.

$$\tan\theta = \tan(\beta_2 - \beta_1) \quad \text{Equation 2}$$

$$= \frac{\tan\beta_2 - \tan\beta_1}{1 + \tan\beta_2 \tan\beta_1}$$

$$= \frac{a}{h}$$

The minimum distance $\Delta h$ between the center point of the first plane 201 and the center point of the first curved surface 202 can be obtained by substituting Equation I and Equation L into Equation 2 and combining with Equation 1.

In this embodiment, it is assumed that the cylinder 100 and the first lens are made of the same material and have the same refraction index $n_1 = 1.5$. $n_1 > n_2$, in which $n_1$ is a refractive index of the cylinder and the first lens, and $n_2$ is a refractive index of air (i.e., $n_1 = 1.5$ and $n_2 = 1$). ($n_1$ and $n_2$ are not shown in the figure)

$$\sin\beta_1 = \frac{1}{1.5}\sin\beta_2 \quad \text{Equation M}$$

$$\cos\beta_1 = \sqrt{1 - \sin^2\beta_1} = \sqrt{1 - \left(\frac{1}{1.5}\sin\beta_2\right)^2} \quad \text{Equation N}$$

Moreover, Equation O can be derived from Equation M and Equation N.

$$\tan\beta_1 = \frac{\sin\beta_1}{\cos\beta_1} \quad \text{Equation O}$$

$$= \frac{\frac{1}{1.5}\sin\beta_2}{\sqrt{1 - \left(\frac{1}{1.5}\sin\beta_2\right)^2}}$$

$$= \frac{\frac{4}{3}\frac{\Delta h}{\sqrt{a^2 + (2\Delta h)^2}}}{\sqrt{1 - \left(\frac{4}{3}\frac{\Delta h}{\sqrt{a^2 + (2\Delta h)^2}}\right)^2}}$$

$$\Rightarrow \tan\beta_1 = \frac{4\Delta h}{\sqrt{9a^2 + 20\Delta h^2}}$$

After substituting the obtained $\tan\beta_1$ (i.e., Equation O) and $\tan\beta_2$ (i.e., Equation I) into Equation 2, Equation P can be obtained.

$$16(5h^2 - 4a^2)\Delta h^4 - 144a^2h\Delta h^3 + 20a^2(h^2 + a^2)\Delta h^2 - 36a^4h\Delta h + 9a^6 = 0 \quad \text{Equation P}$$

The minimum distance $\Delta h$ between the center point of the first plane 201 of the first lens 200 and the center point of the first curved surface 202 of the first lens 200 can be obtained according to Equation 1 and Equation P.

Figure 2:
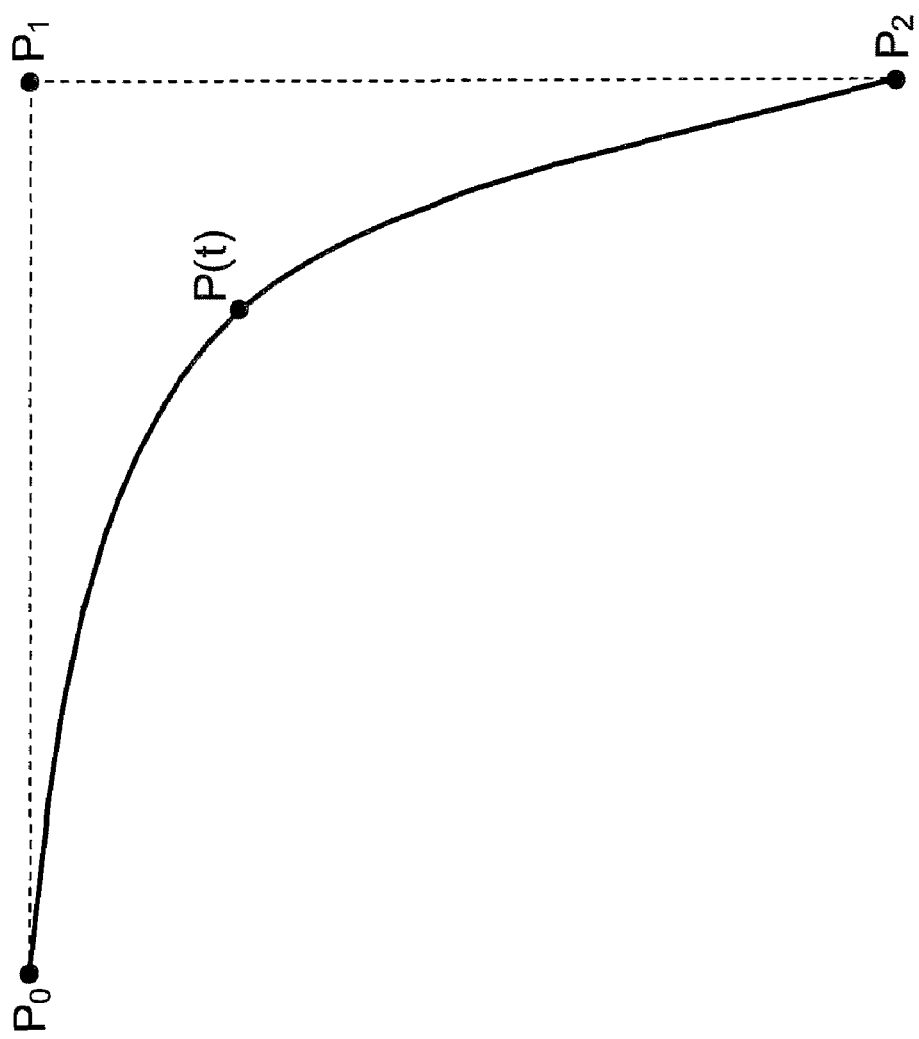
FIG. 2 is a schematic view of positions of points on a first curved surface of the present invention.

FIG. 2 is a schematic view of positions of points on the first curved surface 202 of the present invention. The positions of the points on the first curved surface 202 are obtained according to Equation 3 (i.e., a Bezier Curve), so as to fully define the first curved surface 202.

$$P(t) = (1-t)^2 P_0 + 2t(1-t)P_1 + t^2 P_2 \quad \text{Equation 3}$$

$P(t)$ is a midpoint, $P_0$ is a first endpoint, $P_2$ is a second endpoint, $P_1$ is an intersection point between a curve tangent passing through the first endpoint and a curve tangent passing through the second endpoint. t is a constant between 0 and 1. In the above derivation process of Equation 1 and Equation 2, the position of the midpoint (i.e., $P(t)$) of the first curved surface 202, the position Q (i.e., $P_0$) on the circumference of the cylinder 100 where the first lens 200 is attached to, and another position (not shown) (i.e., $P_2$) corresponding to the Q on the circumference of the cylinder 100 where the first lens 200 is attached to can be obtained, and a curve of the first curved surface 202 can be defined according to Equation 3.

As for a converging element for an LED in this embodiment, the height and the radius of the cylinder of the converging element for an LED required for being used together with the side length of the light-emitting chip are first calculated according to Equation 1. Then, the minimum distance between the center point of the first plane of the first lens and the center point of the first curved surface of the first lens is derived from Equation 2. Finally, positions of the points on the first curved surface are derived from Equation 3. A size of the converging element for an LED suitable for the side length of the light-emitting chip can be obtained by deviation through using Equation 1 to Equation 3, which enables the converging element for an LED to converge a light ray emitted from the light-emitting chip to enable the light ray to form an approximately parallel light ray after passing through the converging element for an LED.

Figure 3:
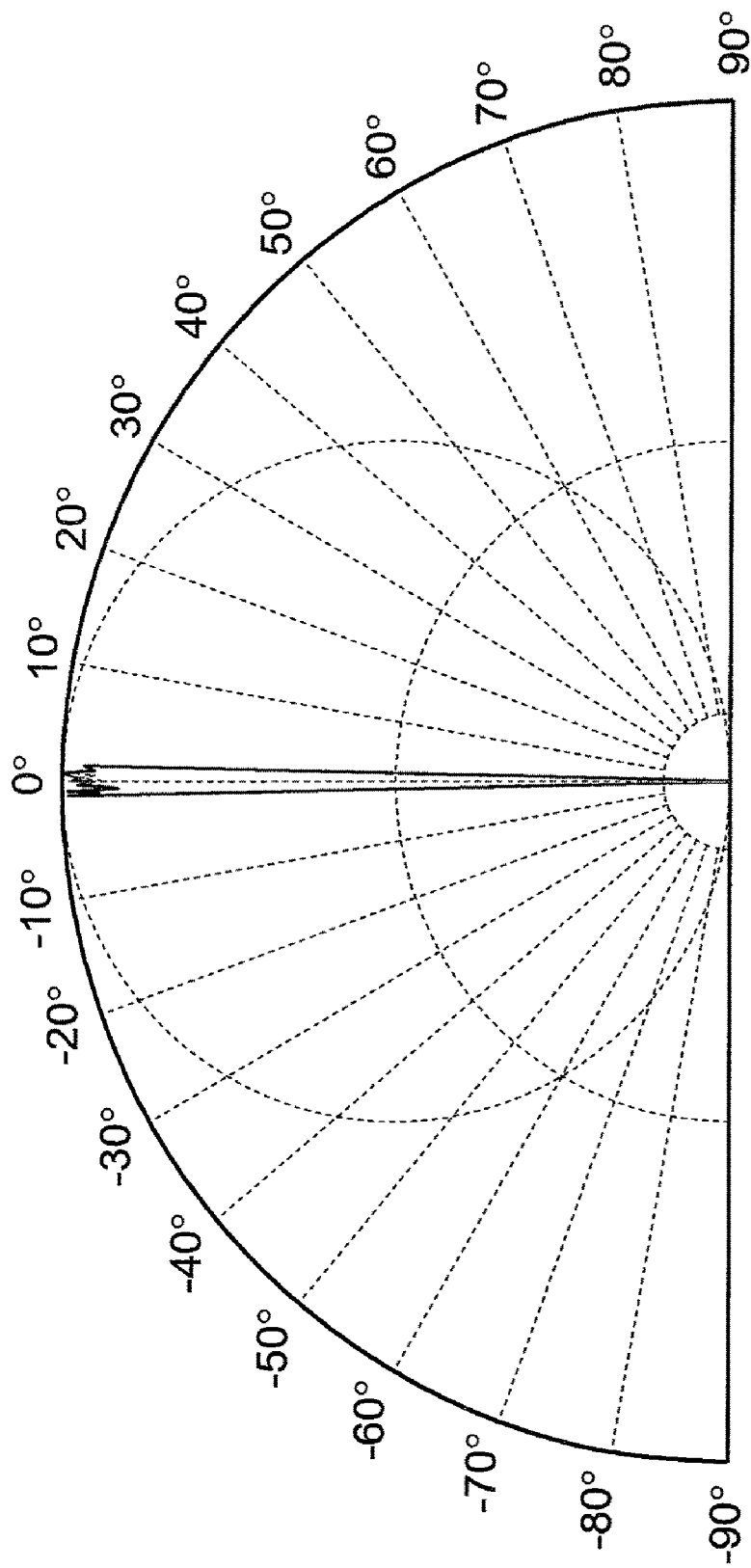
FIG. 3 shows a simulated light-emitting angle of the first embodiment of the present invention.

FIG. 3 shows a simulated light-emitting angle of the first embodiment of the present invention. Referring to FIG. 3, in this simulated view, the side length d of the light-emitting chip is selected to be 40 mil (1 mil=0.0254 mm). Accordingly, the light-emitting angle θ, the height h, and the radius a of the cylinder are derived from Equation 1: θ=28.8°, h=3.0 cm, and a=1.65 cm; and Δh of the first lens is derived from Equation 2: Δh=1.4729 cm. The size of the converging element for an LED is derived according to Equation 1, Equation 2, and Equation 3 of the present invention, which enables the light ray emitted from the adopted light-emitting chip to exit along a parallel direction. The simulation result of FIG. 3 shows that, the emitted light rays finally achieve a light-emitting angle of +/−2° after the converging element for an LED of the present invention is adopted, which indicates that the converging element for an LED of the present invention can change the light rays provided by the light-emitting chip into a narrow-angle convergence feature, thereby effectively converging the energy within +/−2°.

Figure 4:
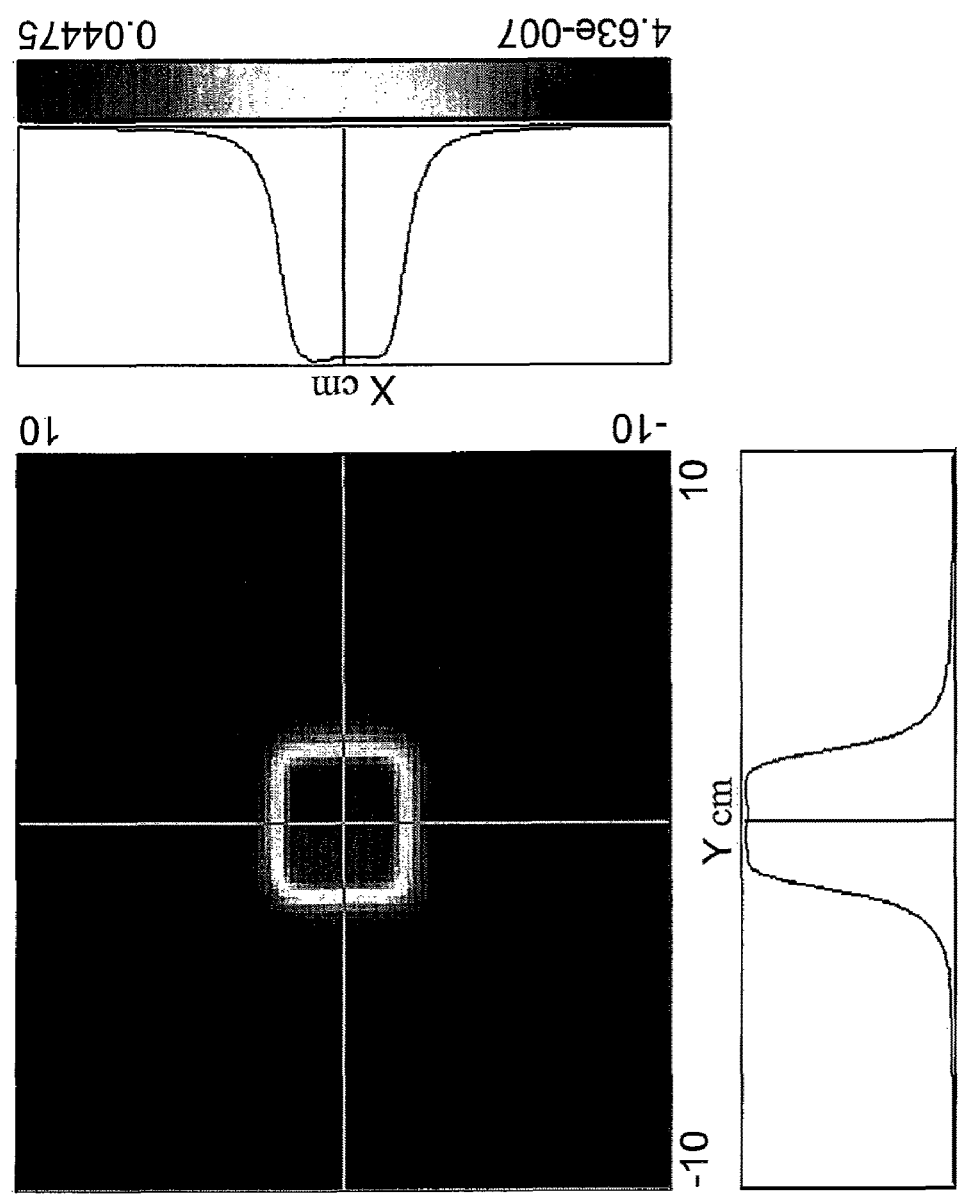
FIG. 4 shows a simulated energy distribution of the first embodiment of the present invention.

FIG. 4 shows a simulated energy distribution of the first embodiment of the present invention. Referring to FIG. 4, in this simulated view, the side length d is 40 mil (1 mil=0.0254 mm), the light-emitting angle θ is 28.8°, the height h of the cylinder is 3.0 cm, the radius a is 1.65 cm, and Δh of the first lens is 1.4729 cm. As seen from FIG. 4 that, the light-illumination energy is uniformly distributed from the center of the optical axis to +/−2° off axis, which indicates that the converging element for an LED of the present invention enables the illumination energy provided by the light-emitting chip to achieve a light-emitting effect with a uniform energy distribution in an area from the center of the optical axis to +/−2° off axis.

Figure 5:
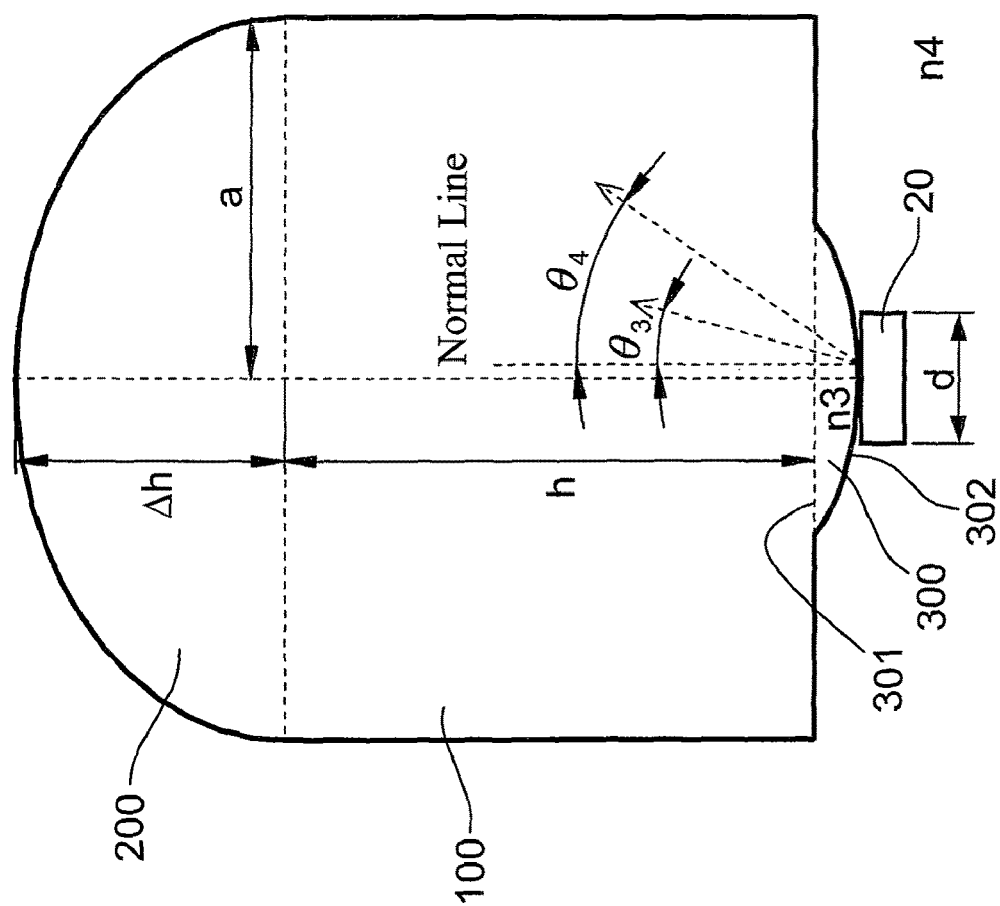
FIG. 5 is a schematic view of a second embodiment of the present invention.

FIG. 5 is a schematic view of a second embodiment of the present invention. Referring to FIG. 5, this embodiment is similar to the first embodiment, but differs in that, a second lens 300 is further disposed between the cylinder 100 and the light-emitting chip 20. The second lens 300 has a second plane 301 and a second curved surface 302 opposite to each other. The second plane 301 of the second lens 300 is attached to the other end of the cylinder 100 opposite to the first lens 200. A center point of the second curved surface 302 of the second lens 300 is attached to the light-emitting chip 20. When the light ray emitted from the light-emitting chip 20 is incident on the second lens 300, the following Equation 4 is satisfied.

$$n_4 \sin \theta_4 \geq n_3 \sin \theta_3;$$

when $$\theta_3 = \tan^{-1} \frac{a}{h},$$

$n_4 < n_3$, is substituted into the equation, the following Equation 4 is obtained.

$$n_4 \sin \theta_4 \geq n_3 \sin\left(\tan^{-1} \frac{a}{h}\right) \quad \text{Equation 4}$$

$n_4$ is a refractive index of air, $n_3$ is a refractive index of the second lens 300, $\theta_4$ is a light-emitting angle of the light-emitting chip 20, and $\theta_3$ is an angle of the light ray emitted from the light-emitting chip 20 when passing through the second curved surface 302 or the second plane 301. As known form Equation 4, when the light ray emitted from the light-emitting chip 20 passes through the second curved surface 302 of the second lens 300, the light-emitting angle can be reduced and the energy can be focused on the first curved surface 202 of the first lens 200, so as to converge the light ray into an approximately parallel light beam.

Figure 6:
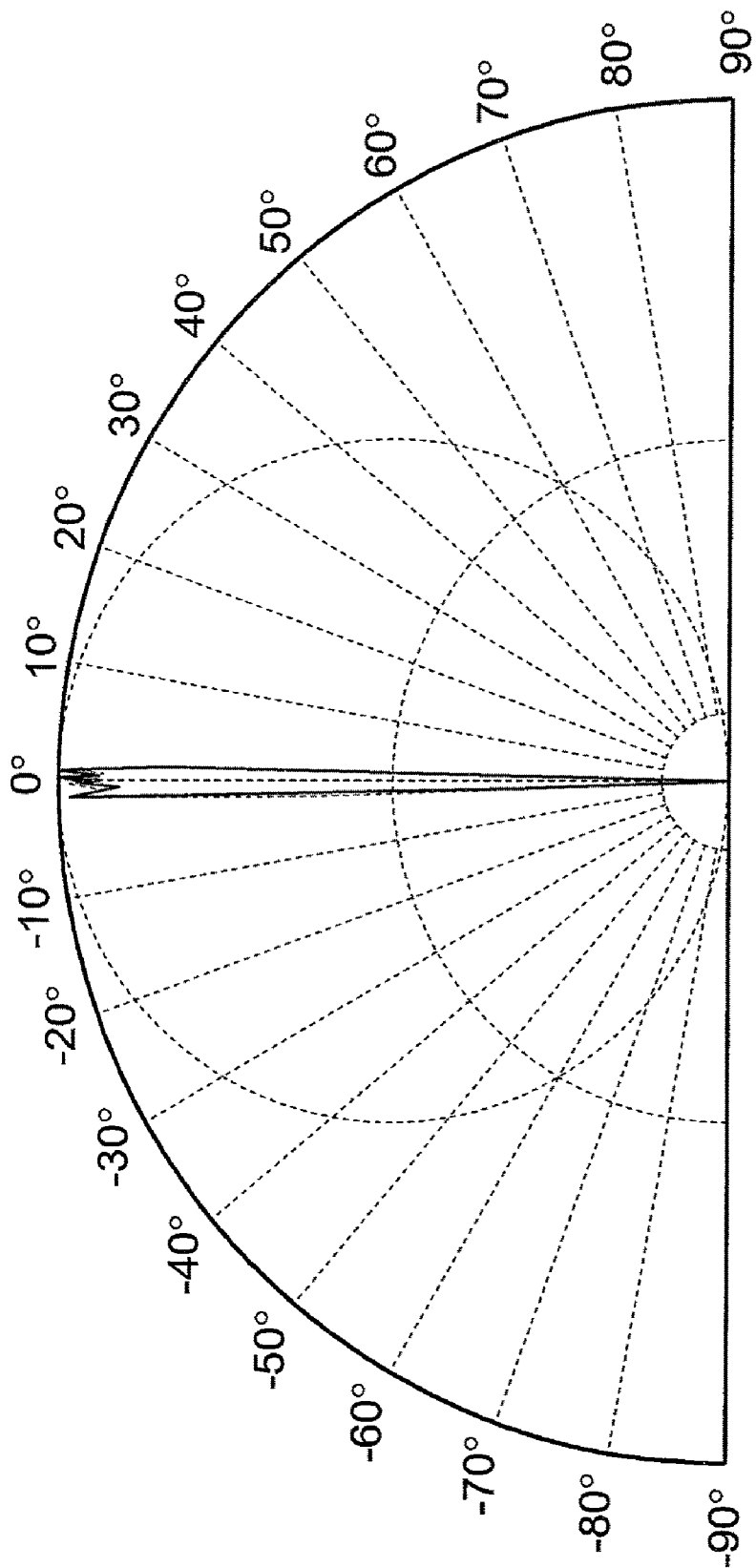
FIG. 6 shows a simulated light-emitting angle of the second embodiment of the present invention.

FIG. 6 shows a simulated light-emitting angle of the second embodiment of the present invention. Referring to FIG. 6, in this simulated view, the side length d is selected to be 40 mil (1 mil=0.0254 mm). Accordingly, the light-emitting angle θ, the height h, and the radius a of the cylinder are derived from Equation 1: θ=28.8°, h=3.0 cm, and a=1.65 cm; and Δh of the first lens is derived from Equation 2: Δh=1.4729 cm. The size of the converging element for an LED is derived according to Equation 1, Equation 2, and Equation 3 of the present invention, which enables the light rays emitted from the adopted light-emitting chip to exit along a parallel direction. The simulation result of FIG. 6 shows that, the emitted light rays finally achieve a light-emitting angle of +/−2° after the converging element for an LED of the present invention is used, which indicates that the converging element for an LED of the present invention can change the light rays provided by the light-emitting chip into a narrow-angle convergence feature, thereby effectively converging the energy within +/−2°.

Figure 7:
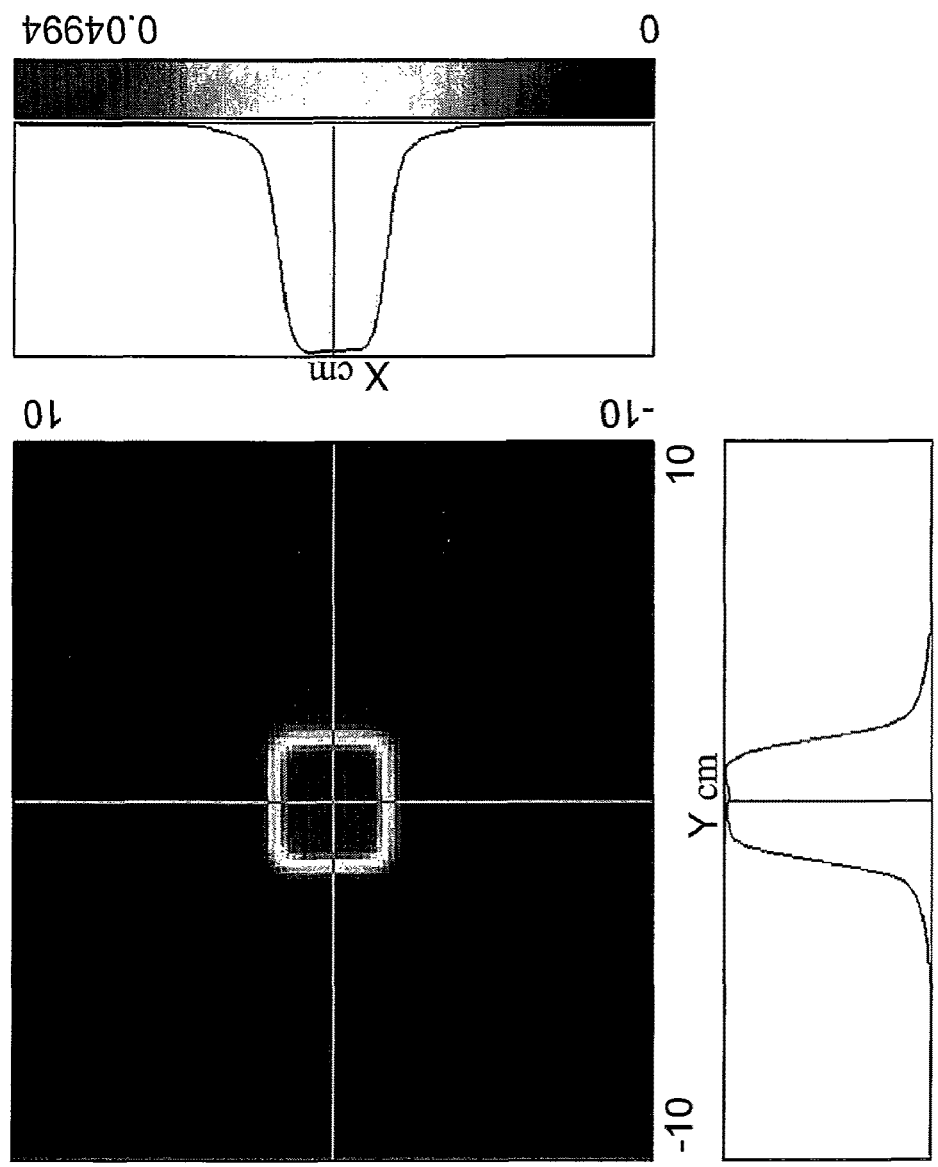
FIG. 7 shows a simulated energy distribution of the second embodiment of the present invention.

FIG. 7 shows a simulated energy distribution of the second embodiment of the present invention. Referring to FIG. 7, in this simulated view, the side length d is 40 mil (1 mil=0.0254 mm), the light-emitting angle θ is 28.8°, the height h of the cylinder is 3.0 cm, the radius a is 1.65 cm, and Δh of the first lens is 1.4729 cm. As seen from FIG. 7 that, the light-illumination energy is uniformly distributed from the center of the optical axis to +/−2° off axis, which indicates that the converging element for an LED of the present invention enables the illumination energy provided by the light-emitting chip to have a light-emitting effect with a uniform energy distribution in an area from the center of the optical axis to +/−2° off axis.

Figure 8:
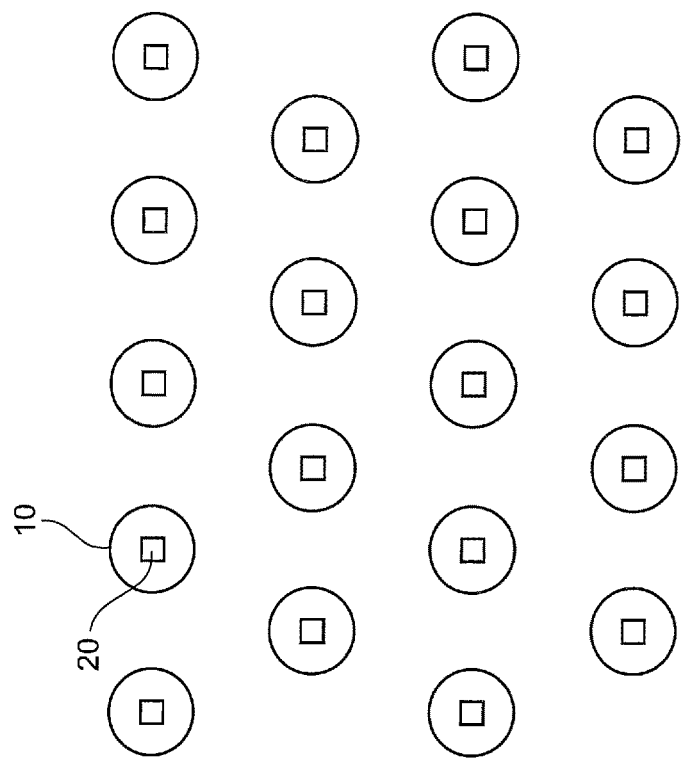
FIG. 8 is a schematic view of a third embodiment of the present invention.

FIG. 8 is a schematic view of a third embodiment of the present invention. Referring to FIG. 8, in this embodiment, a plurality of light-emitting chips 20 is arranged in an equilateral triangle shape, and a plurality of converging elements for LEDs 10 is respectively disposed corresponding to the light-emitting chips 20 for combining the illumination energy of the light-emitting chips 20 to meet a high radiant energy requirement of an exposure machine.

Figure 9:
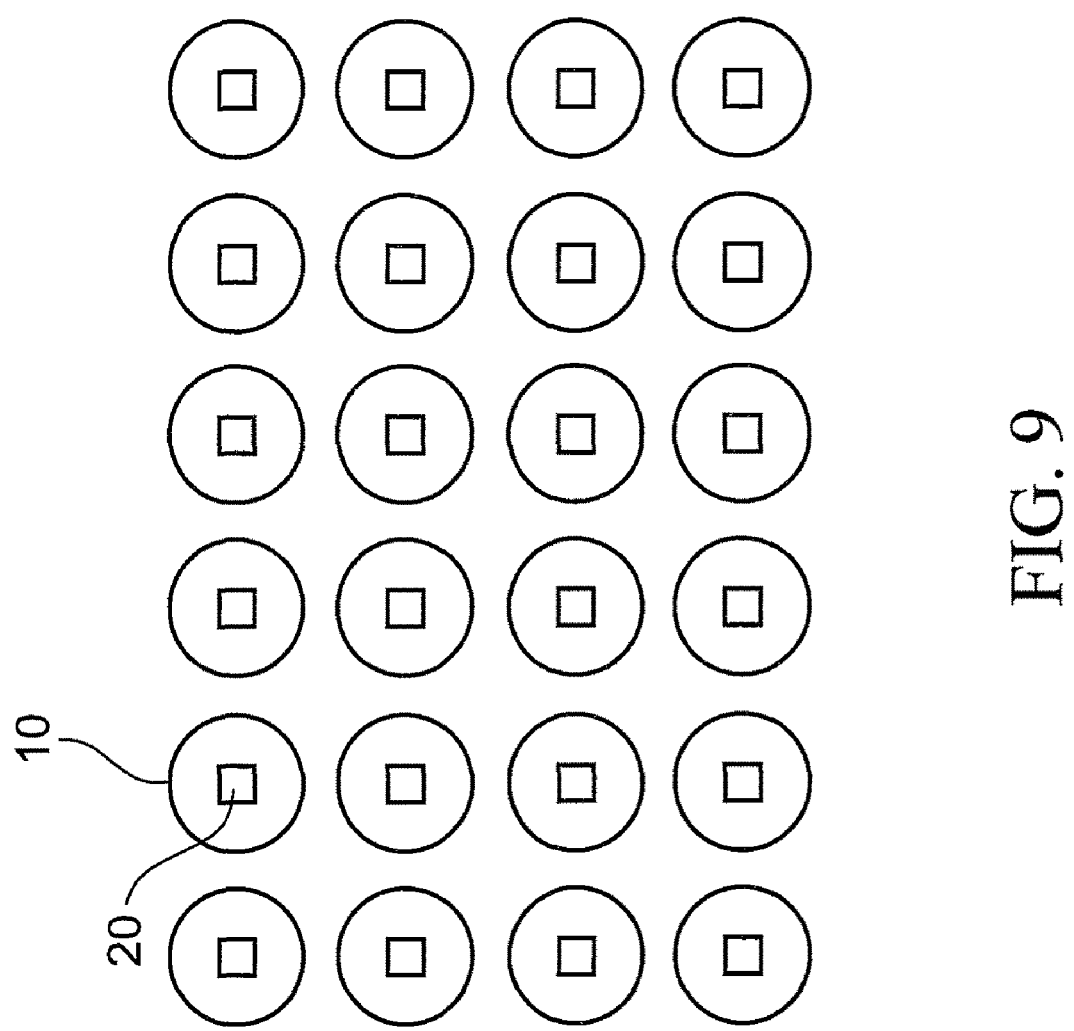
FIG. 9 is a schematic view of a fourth embodiment of the present invention.

FIG. 9 is a schematic view of a fourth embodiment of the present invention. Referring to FIG. 9, in this embodiment, a plurality of light-emitting chips 20 is arranged in an equispaced array, and a plurality of converging elements for LEDs 10 is respectively disposed corresponding to the light-emitting chips 20 for combining the illumination energy of the light-emitting chips 20 to meet a high radiant energy requirement of an exposure machine.

What is claimed is:

1. A converging element for a light-emitting diode (LED), adapted to converge a light ray emitted from a light-emitting chip to enable the light ray to form an approximately parallel light ray after passing through the converging element for an LED, comprising:

a cylinder, disposed on the light-emitting chip, wherein a height and a radius of the cylinder satisfy Equation 1:

$$\tan^{-1}\left(\frac{a}{h}\right) - \tan^{-1}\left(\frac{a}{h} - \frac{d}{2h}\right) \leq 1°, \quad \text{Equation 1}$$

wherein h is the height of the cylinder, a is the radius of the cylinder, and d is a side length of the light-emitting chip; and a first lens, disposed on the other end of the cylinder opposite to the light-emitting chip, wherein the first lens has a first plane and a first curved surface opposite to each other, the first plane of the first lens is attached to the cylinder, and the first curved surface of the first lens satisfies Equation 2:

$$\tan\theta = \tan(\beta_2 - \beta_1)$$
$$= \frac{\tan\beta_2 - \tan\beta_1}{1 + \tan\beta_2 \tan\beta_1}$$
$$= \frac{a}{h},$$

Equation 2

$$\tan\beta_1 = \frac{\sin\beta_1}{\cos\beta_1}$$
$$= \frac{\frac{n_2}{n_1}\sin\beta_2}{\sqrt{1 - \left(\frac{n_2}{n_1}\sin\beta_2\right)^2}}$$
$$= \frac{\frac{n_2}{n_1}\frac{2\Delta h}{\sqrt{a^2 + (2\Delta h)^2}}}{\sqrt{1 - \left(\frac{n_2}{n_1}\frac{2\Delta h}{\sqrt{a^2 + (2\Delta h)^2}}\right)^2}},$$

and $$\tan\beta_2 = \frac{2\Delta h}{a};$$

wherein $n_1$ is a refractive index of the cylinder and the first lens, $n_2$ is a refractive index of air, and $\Delta h$ is a minimum distance between a center point of the first plane of the first lens and a center point of the first curved surface of the first lens.

2. The converging element for an LED according to claim 1, wherein the first curved surface comprises a first endpoint, at least one midpoint, and a second endpoint, and the midpoint is located between the first endpoint and the second endpoint and satisfies Equation 3:

$$P(t) = (1-t)^2 P_0 + 2t(1-t)P_1 + t^2 P_2$$

Equation 3, wherein $P(t)$ is the midpoint, $P_0$ is the first endpoint, $P_2$ is the second endpoint, $P_1$ is an intersection point between a curve tangent passing through the first endpoint and a curve tangent passing through the second endpoint, and t is between 0 and 1.

3. The converging element for an LED according to claim 1, wherein a second lens is disposed between the cylinder and the light-emitting chip.

4. The converging element for an LED according to claim 3, wherein the second lens has a second plane and a second curved surface opposite to each other, the second plane of the second lens is attached to the other end of the cylinder opposite to the first lens, and a center point of the second curved surface of the second lens is attached to the light-emitting chip.

5. The converging element for an LED according to claim 4, wherein when the light ray emitted from the light-emitting chip is incident on the second lens, Equation 4 is satisfied:

$$n_4 \sin\theta_4 \geq n_3 \sin\left(\tan^{-1}\frac{a}{h}\right),$$

Equation 4 wherein $n_4$ is a refractive index of air, $n_3$ is a refractive index of the second lens, $\theta_4$ is a light-emitting angle of the light-emitting chip, and $\theta_3$ is an angle of the light ray emitted from the light-emitting chip when passing through the second curved surface or the second plane.

* * * * *